United States Patent [19]
Hoshi et al.

[11] Patent Number: 5,675,169
[45] Date of Patent: Oct. 7, 1997

[54] MOTOR DRIVING CIRCUIT WITH SURGE DETECTION/PROTECTION AND ITS STRUCTURE IN A SEMICONDUCTOR DEVICE

[75] Inventors: Masakatsu Hoshi, Yokohama; Teruyoshi Mihara, Yokosuka; Kraisorn Throngnumchai, Yokohama, all of Japan

[73] Assignee: Nissan Motor Co., Ltd., Yokohama, Japan

[21] Appl. No.: 451,750

[22] Filed: May 26, 1995

Related U.S. Application Data

[63] Continuation of Ser. No. 189,872, Feb. 1, 1994, abandoned.

[30] Foreign Application Priority Data

Feb. 21, 1993 [JP] Japan ................... 5-055084

[51] Int. Cl.$^6$ .......... H01L 23/62; H01L 29/76; H01L 29/94; H02H 5/04
[52] U.S. Cl. .......... 257/355; 257/328; 257/337; 257/343; 257/362; 361/23; 361/30
[58] Field of Search .................. 257/328, 337, 257/338, 339, 341, 342, 343, 470, 355, 361, 362, 363, 368; 361/23, 24, 30, 33, 90, 91, 100, 118, 139, 152

[56] References Cited

FOREIGN PATENT DOCUMENTS

| 40 12 382 C2 | 7/1992 | Germany | 257/341 |
| 57-172765 | 10/1982 | Japan | 257/136 |
| 1-91620 | 4/1989 | Japan | 257/341 |

OTHER PUBLICATIONS

MacIver, Bernard A. et al., "Characteristics of Trench j-MOS Power Transistors", *IEEE Electron Device Letters*, vol. 10, No. 8 (Aug. 1989).

Chang, H.-R. et al., "500-V n-Channel Insulated-Gate Bipolar Transistor with a Trench Gate Structure", *IEEE Transactions on Electron Devices*, vol. 36, No. 9 (Sep. 1989).

Brauschke, P. et al, "Tempfet: Schritt zum idealen Leistungshalbleiterschalter", Siemens Components 27 (1989), vol. 6, pp. 228–232.

Sax, H., "Motorbrücke mit hohem Wirkrungsgrad", Elektronik 22/30, Oct. 1987, pp. 94–95.

*Primary Examiner*—Steven H. Loke
*Attorney, Agent, or Firm*—Foley & Lardner

[57] ABSTRACT

A semiconductor device having a surge input detecting circuit is provided with the driving circuit for, for example, reversible motor. To prevent MOS power transistors constituting the power driving circuit from their destructive breakdowns (failures), when the surge input detecting circuit block detects the surge voltage input through the driving circuit which exceeds a predetermined voltage, namely, a maximum rated power supply voltage of the power driving circuit, the surge input detecting circuit outputs the signal to turn the MOS power transistors in off-states. These circuit elements are integrally mounted on a semiconductor chip. The surge input detecting circuit block detects such a surge input through a power supply terminal in terms of either of its voltage, its current, or the temperature rise in the semiconductor chip. The breakdown voltage per power transistor can be half the maximum rated power supply voltage. In addition, the surge input detecting circuit block and these power MOS transistors are fabricated into the same semiconductor chip.

15 Claims, 11 Drawing Sheets

MOTOR DRIVING CIRCUIT WITH SURGE DETECTION/PROTECTION AND ITS STRUCTURE IN A SEMICONDUCTOR DEVICE

This application is a continuation of application Ser. No. 08/189,872, filed Feb. 1, 1994, now abandoned.

BACKGROUND OF THE INVENTION

1. Field of the Invention

The present invention relates generally to a semiconductor device having a large power driving circuit for a load such as a reversible motor and particularly, relates to a semiconductor device in which the power driving circuit is formed using a half bridge constituted by a plurality of series-connected power transistors.

2. Description of the Background Art

In a case where a reversible motor is revolved in a normal direction or in a reverse direction, a power driving circuit for the motor which is a combination of a half bridge, the half bridge having a plurality of power transistors in a cascade connection, is convenient and has been used.

The power driving circuit in which two half bridge power transistor circuits are combined to form an letter H-shaped bridge configuration can perform a revolution control of the reversible motor in the normal or reverse direction only by changing signals to be applied to gates of the power transistors so that, so-called, contactless switching of the revolution direction of the motor can be achieved. Therefore, a life of the transistors and associated motor can be elongated and a reliability of the power driving circuit can be enhanced.

In addition, the power driving circuit can be integrated on a single semiconductor substrate so that the size of the power driving circuit can be reduced and its fabrication cost can be reduced, thus such a power driving circuit as described above being widely utilized to control a load, for example, the motor.

Such semiconductor devices as described above are susceptible to input of high surge voltages depending on their environmental situations. Such a surge voltage usually occurs when a terminal used for charging a battery cell of such an automotive vehicle is accidentally disconnected from a terminal of the battery cell or when a cloud-to-ground discharge occurs. Such a surge voltage as described above often indicates a high voltage from several ten volts up to a proximity to one hundred volts and its surge energy is very large.

With a current from a power supply terminal of the power driving circuit being caused to flow through a first power transistor of one half bridge, the motor, and a fourth power transistor of the other half bridge to the ground, if the surge voltage is applied to the power supply terminal, a surge current would be caused to flow from the power supply terminal to the ground via the first and series-connected third power transistor of the one half bridge and via a second power transistor of the other half bridge and series-connected fourth power transistor of the other half bridge, not passing through the motor, if a breakdown voltage between a drain and source of each power transistor is set to be lower than the surge voltage.

Consequently, destructive breakdowns of the first, second, third and fourth power transistors and associated diodes would occur.

To prevent such semiconductor device failures as described above, it is necessary to make a drain source breakdown voltage of every power transistor of the two half bridges higher than the surge voltage.

On the contrary, if the breakdown voltages for all of the MOS devices used for the power transistors are made higher to cope with the input surge, their on resistances are accordingly increased. Particularly, in a case where MOSFET devices are used in such an H-Shaped bridge driving circuit, a power loss of the whole H-shaped bridge circuit is remarkably increased.

SUMMARY OF THE INVENTION

It is therefore a principal object of the present invention to provide a semiconductor device in which a power driving circuit is provided using a half bridge constituted by a plurality of series-connected power transistors which can prevent the power transistors from their destructive breakdowns and which can achieve a relatively low breakdown voltage per power transistor being used as one of the half bridge, maintaining a reduction of a power loss.

The above-described object can be achieved by providing a semiconductor device, comprising: a) a power driving circuit having a half bridge of at least two series-connected power transisitors; and b) surge input detecting means for detecting an input of a surge voltage exceeding a predetermined voltage between a power supply terminal of said power driving circuit and the ground of said series-connected power transistors and for generating gate signals to turn said power transistors to off-states.

DETAILED DESCRIPTION OF THE PREFERRED EMBODIMENTS

Figure 1:
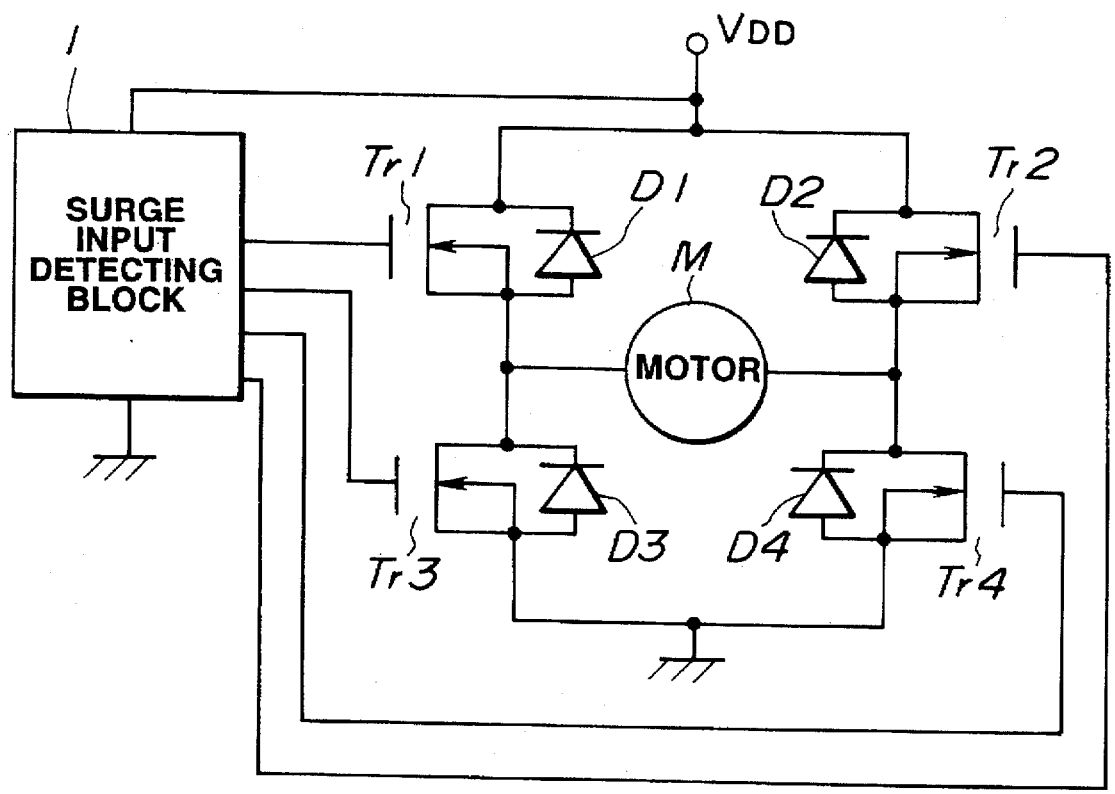
FIG. 1 is a circuit block diagram representing a general concept of all preferred embodiments according to the present invention.

FIG. 1 shows a general concept of a semiconductor device according to the present invention which is applicable to a motor revolution control.

That is to say, two first and third MOS power transistors Tr1 and Tr3 are connected in series with each other so as to form a first half bridge and other two second and fourth MOS power transistors Tr2 and Tr4 are connected in series with each other so as to form a second half bridge. The first half bridge and second half bridge constitute a letter H-shaped bridge with a reversible motor M. A junction between the first MOS power transistor Tr1 and the third MOS transistor Tr3 is connected to one end of the reversible motor M and another junction between the second MOS power transistor Tr2 and the fourth MOS power transistor Tr4 is connected to the other end of the reversible motor M. It is noted that, as shown in FIG. 1, diodes (freewheel diodes) D1 through D4 are connected between the drain and source electrodes of the respective MOS power transistors Tr1 through Tr4.

When drive signals are applied to respective gates of the first and fourth MOS transistors Tr1 and Tr4 to make the first and fourth MOS power transistors in on-states and reverse drive signals are applied to respective gates of the second and third MOS transistors Tr2 and Tr3 to make the second and third MOS transistors Tr2 and Tr3 in off-states, a current from a power supply $V_{DD}$ flows through the motor M via the first and fourth MOS power transistors to the ground so that the motor is revolved in the normal direction. On the contrary, when the drive signals are applied to the gates of the second and third MOS power transistors Tr2 and Tr3 to make them in the on-state and reverse drive signals are applied to the gates of the first and fourth MOS power transistors Tr1 and Tr4 to make them in the off-state, the current from the power supply $V_{DD}$ flows through the motor M via the second and third MOS transistors Tr2 and Tr3 so that the motor M is revolved in the reverse direction.

As shown in FIG. 1, the source of the first MOS power transistor Tr1 and the drain of the third MOS power transistor Tr3 are interconnected to form the first half bridge and the source of the second MOS power transistor Tr2 and the drain of the fourth MOS power transistor Tr4 are interconnected to form the second half bridge.

The first half bridge is connected to the motor M to which the second half bridge is connected so that a letter H-shaped bridge power driving circuit is constituted.

In the embodiments of the semiconductor devices, a surge input detecting circuit block denoted by 1 is connected to a power supply line of the power supply $V_{DD}$, to the ground (GND), and to all gates of the first, second, third, and fourth MOS power transistors Tr1 through Tr4.

As shown in FIG. 1, diodes (freewheel diodes) D1 through D4 are connected between the drains and sources of the respective MOS power transistors Tr1 through Tr4.

In FIG. 1, both sources of the third and fourth MOS power transistors are grounded.

It is also noted that a control circuit to provide the drive signals and reverse drive signals for the gates of all MOS power transistors via wires is omitted herein.

The surge input detecting block 1 is connected to the power supply terminal $V_{DD}$ and the gates of all MOS power transistors Tr1 through Tr4 and monitors whether a presence or absence of generation of the high surge voltage exceeding a predetermined voltage on the power supply line. The surge input detecting circuit block 1 outputs the reverse drive signals to the respective MOS power transistors so that all of MOS power transistors are in the off-states and no surge current flows in the MOS power transistors Tr1 through Tr4. Thus, the destructive breakdowns of the MOS power transistors Tr1 through Tr4 can be prevented.

Since, at this time, the MOS power transistors Tr1 through Tr4 do not receive a voltage exceeding the predetermined voltage, a sum of a breakdown voltage between the drain and source of each of the series-connected MOS power transistors Tr1 and Tr3 or Tr2 and Tr4 may be slightly higher than its maximum rated power supply voltage of the power driving circuit. Hence, in the case of the two series-connected MOS power transistors constituting the half bridge, the breakdown voltage of the individual MOS power transistors may be approximately half the maximum rated power supply voltage so that a low breakdown voltage of the individual MOS power transistors can be achieved. And, the lowered breakdown voltage permits a reduction in power loss of the power driving circuit, namely, the individual power transistors.

Figure 2:
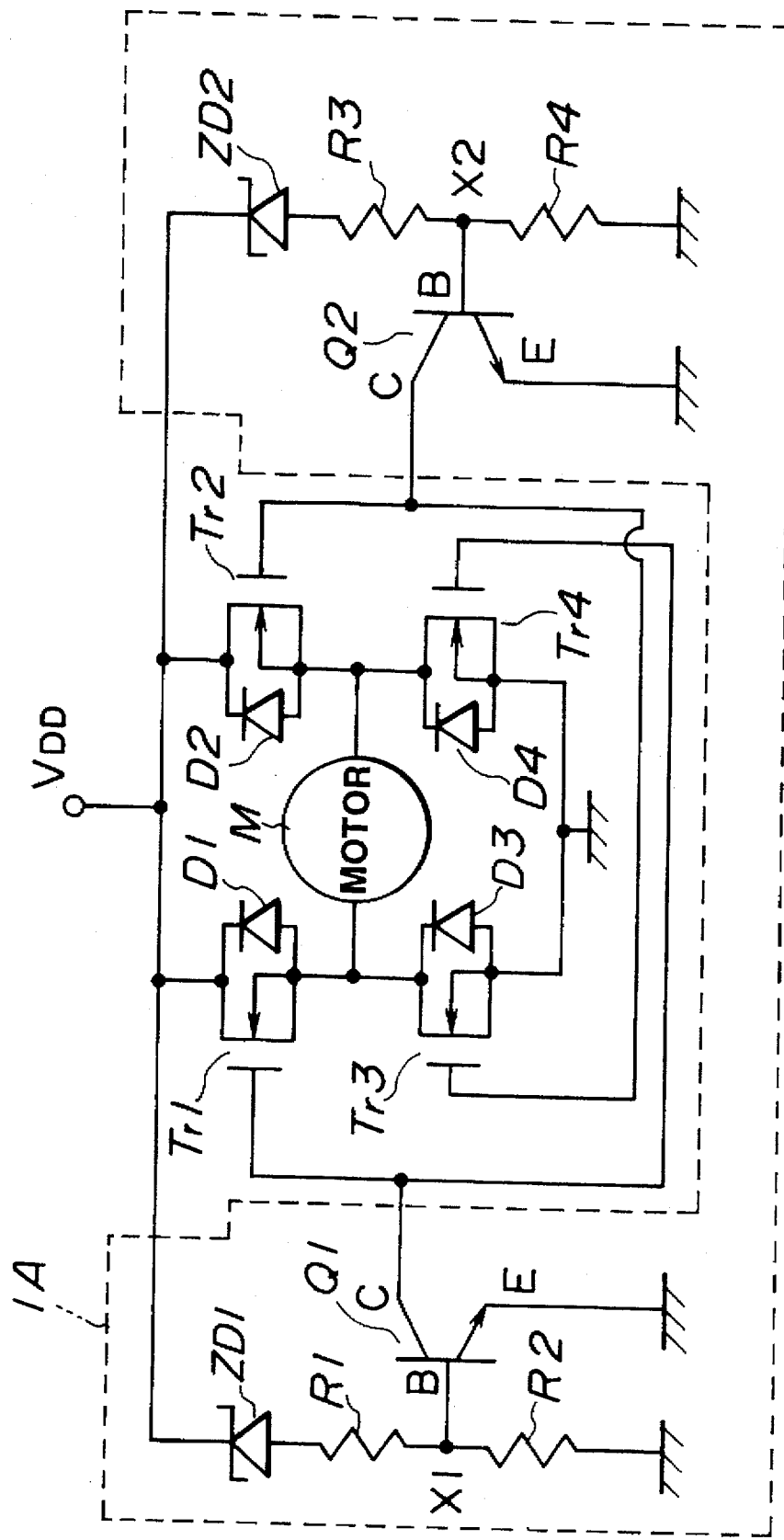
FIG. 2 is a circuit wiring diagram of a semiconductor device in a first preferred embodiment according to the present invention.

FIG. 2 shows a first embodiment of the semiconductor device according to the present invention.

Each gate of the MOS transistors Tr1 through Tr4 is connected to a surge input detecting circuit 1A which detects the surge input in terms of its voltage as the surge input detecting circuit block 1.

The surge input detecting circuit 1A includes: a zener diode ZD1 whose cathode is connected to the power supply $V_{DD}$; two resistors R1 and R2, connected in series with each other and connected between an anode of the zener diode ZD1 and the ground; and a transistor Q1 whose base B is connected to a junction X1 between the two resistors R1 and R2, whose collector C is connected to each gate of the first and fourth MOS transistors Tr1 and Tr4, and whose emitter is grounded.

In the same way, the surge input detecting circuit 1A further includes: a zener diode ZD2 whose cathode is connected to the power supply; two resistors R3 and R4, connected in series with each other and connected between an anode of the zener diode ZD2 and the ground; and a transistor Q2, whose base B is connected to a junction X2 between the two resistors R3 and R4, whose collector C is connected to each gate of the second and third MOS transistors Tr2 and Tr3, and whose emitter E is grounded.

It is noted that each avalanche breakdown voltage of the two zener diodes ZD1 and ZD2 is set to a value lower than each avalanche breakdown voltage of the MOS transistors Tr1 through Tr4.

If the surge voltage exceeding the maximum rated power supply voltage is applied to the power supply $V_{DD}$ and its surge voltage exceeds each breakdown voltage of the zener diodes ZD1 and ZD2, a current flows through the two resistors R1 and R2 or R3 and R4 so that a potential of the junction X1 or junction X2 rises. Thus, either the transistor Q1 or transistor Q2 is conducted. Consequently, either the transistors Tr1 and Tr4 or the transistors Tr2 and Tr3 are in the off-states (non-conducted).

It is noted that since resistance values of the resistors R1 and R3 are set to a value larger than several hundreds ohms, the surge current passing through the zener diodes ZD1 and ZD2 is suppressed. Therefore, an occupied area of each zener diode ZD1 or ZD2 in the semiconductor chip can be equal to or less than 1 mm$^2$.

As described above, in the first embodiment, since the zener diodes ZD1 and ZD2 detect the occurrence of the surge voltage exceeding the maximum rated power supply voltage and the MOS transistors Tr1 through Tr4 are in the off-states, the breakdown voltage per MOS transistor can be halved so that the power loss can be reduced.

Figure 3:
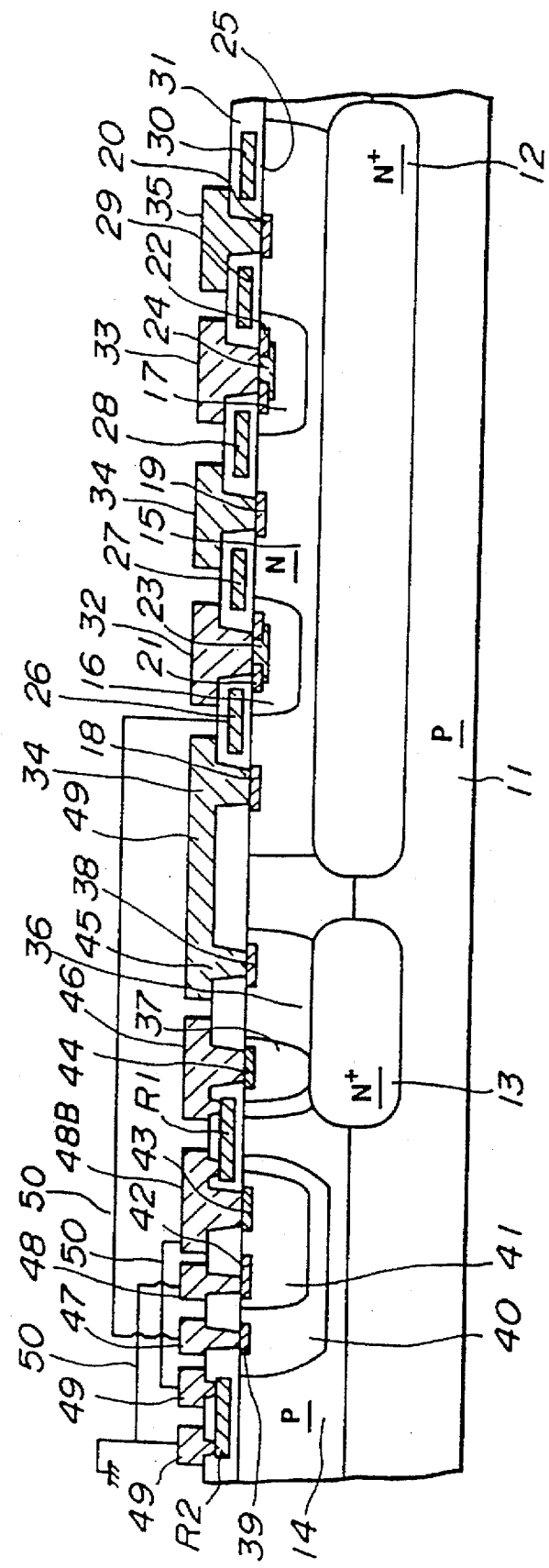
FIG. 3 is a cross sectional view of a semiconductor chip in which the circuit of the first embodiment shown in FIG. 2 is formed.

FIG. 3 shows a cross sectional view of a part of a semiconductor chip in which the above-described power driving circuit and surge input detecting circuit 1A in the first embodiment is fabricated.

In FIG. 3, there is a p type silicon substrate 11 at the bottom of the semiconductor chip.

The p type silicon substrate has an upper main surface on which mutually separated highly doped n$^+$ type buried layers 12 and 13 are formed. An epitaxially grown p type layer 14 is, then, formed on a part of the upper surface of the p type silicon substrate 11 and parts of surfaces of the n$^+$ type buried layers 12 and 13.

Then, an n type region 15 is formed aside the p type layer 14, reaching the n$^+$ type buried layer 12 within the p type layer 14.

In addition, p type base regions 16 and 17 are formed within the n type region 15 to constitute built-in p-n junction diodes between source electrodes 32 and 33 and drain electrodes 34 and 35, respectively.

Furthermore, highly doped n$^+$ type drain regions 18, 19, and 20 are formed within the n type region 15, spaced apart from each other.

Next, n$^+$ type source regions 21 and 22 and p type regions 23 and 24 are formed within the respective p type base regions 16 and 17.

A gate insulating film 25 is formed on the upper surface of the n type region 15 (upper surfaces of the n$^+$ type drain regions 18, 19, and 20, p type regions 16 and 17, and n$^+$ source regions 21 and 22 inclusive) and, furthermore, gate electrodes 26, 27, 28, 29, and 30 are formed on the upper surface of the gate insulating film 25.

The gate electrodes 26, 27, 28, 29, and 30 are furthermore covered with interlayer insulating films 31 to isolate them from the other regions and other electrodes to form the insulated gates and the interlayer insulating films 31 are partially stripped off (removed or etched off) to expose them so that metallic films constituting the source electrodes 32 and 33 are contacted with the source regions 23 and 24 and those constituting the drain electrodes 34 and 35 are contacted with the drain regions 18, 19, and 20, respectively.

Thus, in a right side of the semiconductor chip shown in FIG. 3, lateral type N-channel power MOS transistors Tr1 and Tr2 with the built-in diodes D1 and D2 are formed.

On the other hand, in a left side of the semiconductor chip of FIG. 3, n type cathode region 36 of the zener diode ZD1 is formed within the p type layer 14 so as to touch the n$^+$ type buried layer 13.

Within the p type layer 14, p type anode region 37 of the zener diode ZD1 is formed so as to touch the n$^+$ type buried layer 13.

It is noted that to improve an electrical contact, n$^+$ type region 38 and p$^+$ type region 44 are formed within the respective cathode and anode regions 36 and 37.

A bipolar transistor n type collector region 40 is formed within the p type layer 14 adjacent to the n type cathode region 36 described above. A p type base region 41 is formed within the n type collector region 40. Then, in the p type base region 41, an n type emitter region 42 is formed.

Both n$^+$ type region 39 and p$^{30}$ type region 43 are formed within the respective n type collector region 40 and p type base region 41.

A metallic is film constituting a collector electrode 47 is contacted with the n$^+$ type region 39 and a metallic film constituting a base electrode 48B is contacted with the p$^{30}$ type region 43.

Then, in the same way, the upper main surfaces of the p type region 14, the n type collector region 40, the p type base region 41, n$^+$ type region 39, and p$^{30}$ type region are covered with the insulating film 25 and the resistors R1 and R2 are formed by means of polycrystalline silicons.

This insulating film 25 and resistors R1 and R2 are formed at the same time when the MOS gate insulating film 25 and the MOS gate electrodes 26, 27, 28, 29, and 30, located at the right side of FIG. 3, are formed.

The overall surface is covered with the insulating film 31 and partially removed (stripped off or etched off) to form the zener diode cathode 45, zener diode anode 46, bipolar transistor collector electrode 47, emitter electrode 48, and base electrode 48B Thereafter, another insulating film (not shown in FIG. 3) covers the whole surface of the semiconductor chip and is windowed (etched off) so that an electrical connection is made with a metallic wire 50. It is noted that a metallic film 49 is contacted with one end of the resistor R2, another metallic film 49 is contacted with the other end of the resistor R2 and is connected to the base electrode 48B via the wire 50. Namely, the wire 50 is connected to the p type base 41 and resistor R2. The bipolar transistor collector electrode 47 is connected to the gate electrode 26 of the first lateral type N-channel power MOS transistor via the wire 50. The base electrode 48B is contacted with one end of the resistor R1. The anode electrode 46 is contacted with the other end of the resistor R1. The cathode electrode 45 is integrally contacted with the drain electrode 34 via the metallic film 49.

In the way described above, the first transistor of the first and second half bridges and half of the surge input detecting circuit 1A shown in FIG. 2 is fabricated in the single semiconductor chip as shown in FIG. 3.

Furthermore, the second transistor of the first and second half bridge and the other half of the input surge detecting circuit 1A can be fabricated in the same structure shown in FIG. 3.

Thus, the H-shaped bridge circuit and input surge detecting circuit 1A can more compactly be fabricated in the single semiconductor chip.

Figure 4:
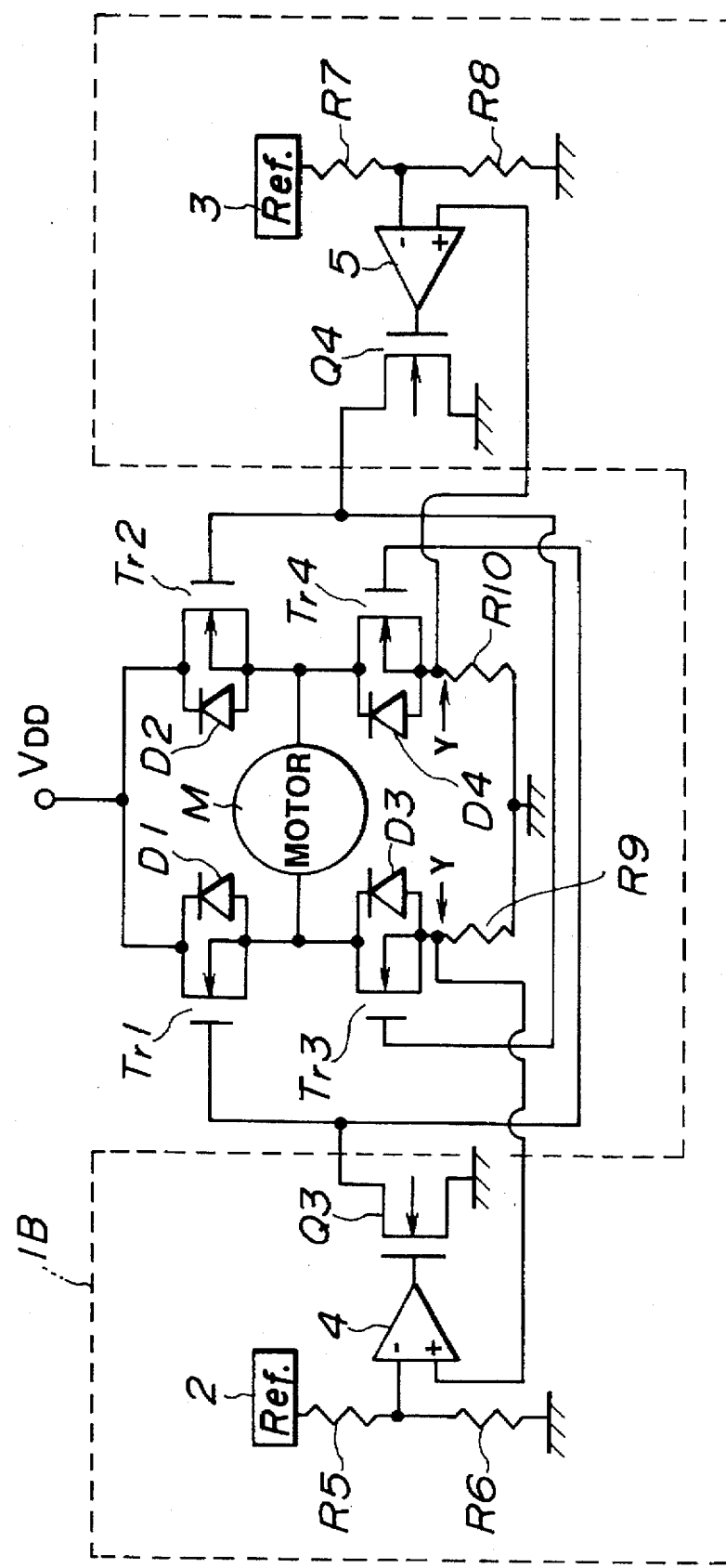
FIG. 4 is a circuit wiring diagram of the semiconductor device in a second preferred embodiment according to the present invention.

FIG. 4 shows a second preferred embodiment of the semiconductor device.

In the second embodiment, the surge input detecting circuit block 1 is a surge detecting circuit 1B which detects the input of surge in terms of its current.

In FIG. 4, two reference voltage supplies (Ref) 2 and 3 are installed into the surge detecting circuit 1B. Two resistors R5 and R6 are connected in series with each other between the one reference voltage supply 2 and the ground. Two resistors R7 and R8 are connected in series with each other between the other reference voltage supply 3 and the ground.

Each junction of the two resistors R5 and R6, R7 and R8 is connected to an inverting (minus) input terminal of a comparator 4 or 5. A non-inverting (plus) input terminal of the comparator 4 or 5 is connected to a junction Y between the source of the third power MOS transistor Tr3 and a resistor R9 or a junction Y between the source of the fourth power MOS transistor Tr4 and a resistor R10. The other end of each resistor R9 or R10 is grounded.

An output end of the comparator 4 or 5 is connected to a gate of each MOS transistor Q3 or Q4. A source of each MOS transistor Q3 or Q4 is grounded. The drain of the MOS transistor Q3 is connected to the gates of the first power MOS transistor Tr1 and the fourth power MOS transistor Tr4. The drain of the opposing MOS transistor Q4 is connected to the gates of the second power MOS transistor Tr2 and of the third power MOS transistor Tr3.

When the surge voltage is applied to the power supply terminal $V_{DD}$, a current due to the surge flows through the first MOS transistor Tr1, motor M, and the fourth MOS transistor Tr4 to the junction Y or flows through the second MOS power transistor Tr2, motor M, and the third MOS power transistor Tr3 to the junction Y. The current finally reaches the ground. Thus, a potential of either junction Y with respect to the ground is increased. If the potential of either junction Y exceeds the reference voltage at the inverting input terminal of the comparator 4 or 5, the comparator 4 or 5 outputs a voltage according to a difference between the reference voltage at the inverting input terminal and the voltage at the non-inverting input terminal, the difference voltage being input to the gate of the corresponding MOS transistor Q3 or Q4 to turn the MOS transistor Q3 or Q4 in the on state (in the active state).

When both of the transistors Q3 and Q4 are in the on-state, all of four MOS power transistors Tr1 through Tr4 are, in turn, in non-condution states (in the off-states) so that the above-described current does not flow, thereby destructive breakdowns of all MOS power transistors Tr1 through Tr4 being prevented.

Since the two reference voltage supplies 2 and 3 do not serve to directly drive such an electrical equipment as the motor M, a large power is not needed. Even if semiconductor elements having large breakdown voltages, each exceeding the surge voltage, constitute the reference power supplies 2 and 3, their power losses are negligible.

Figure 5:
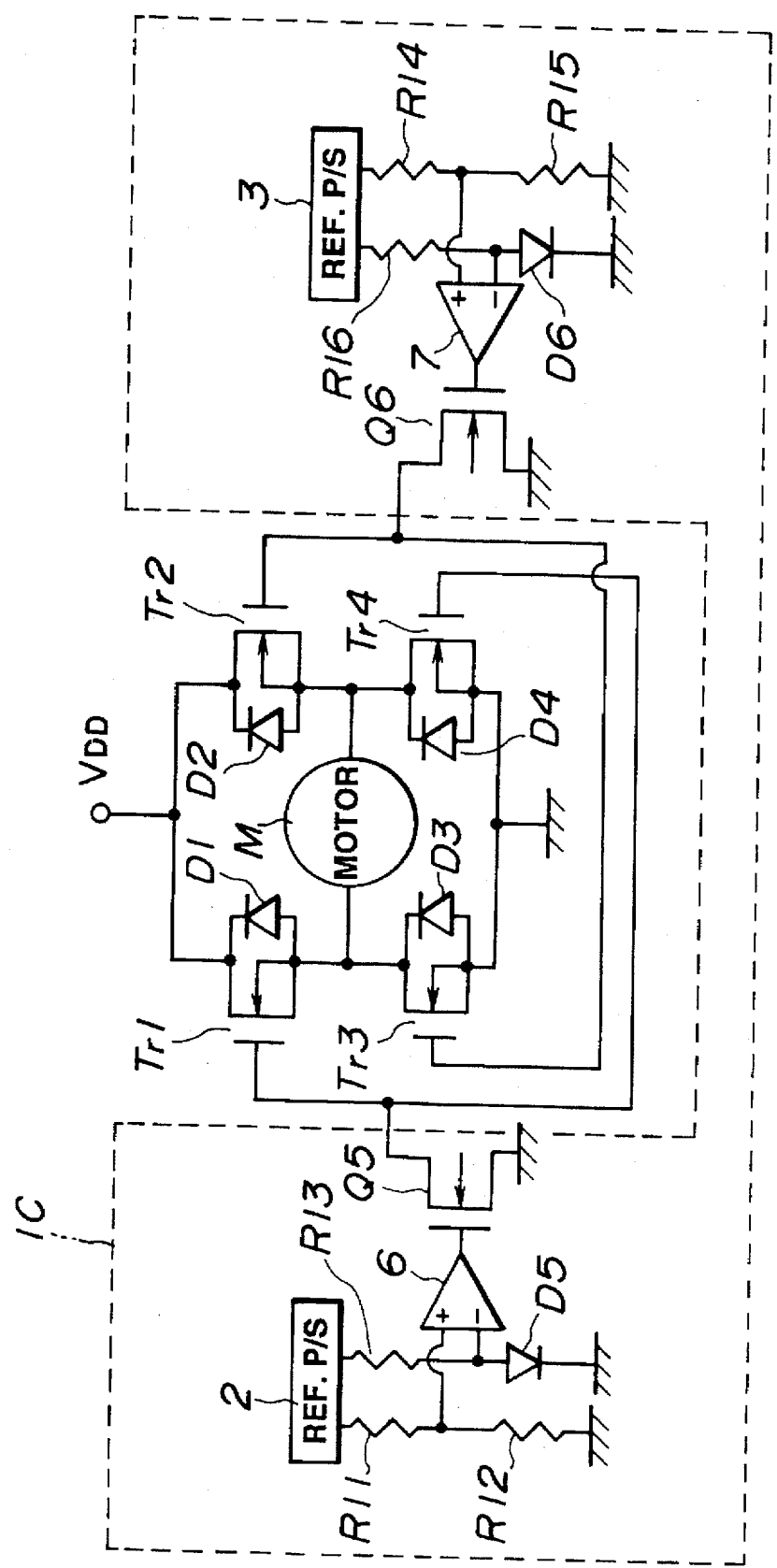
FIG. 5 is a circuit wiring diagram of the semiconductor device in a third preferred embodiment according to the present invention.

FIG. 5 shows a third preferred embodiment of the semiconductor device according to the present invention.

The surge input detecting circuit block 1 is constituted by a surge input detecting circuit 1C which detects the input of the surge voltage in terms of its temperature change.

In FIG. 5, resistors R11 and R12 are connected in series with each other between the one reference voltage supply 2 and the ground.

Resistors R14 and R15 are connected in series with each other between the reference voltage supply 3 and the ground. A junction between the two series-connected resistors R11 and R12 is connected to the non-inverting input terminal of the comparator 6. A junction between the two-series connected resistors R14 and R15 is connected to the non-inverting input terminal of a comparator 7. An inverting input terminal of the comparator 6 is connected to a junction between one end of a resistor R13 and an anode of a diode D5. The other end of the resistor R13 is connected to the reference voltage supply 2 and the cathode of the diode D5 is grounded. In the same way, the inverting input terminal of the comparator 7 is connected to a junction between one end of a resistor R16 and the anode of a diode D6. The cathode of the diode D6 is grounded.

The other connections related to both MOS transistors Q5 and Q6 are the same as those in the case of the MOS transistors Q3 and Q4 in the second embodiment described above. However, the non-inverting input terminals of both comparators are connected to the junction of both resistors R11 and R12, R14 and R15 in the case of the third embodiment.

In the same way as the first and second preferred embodiments, the power driving circuit and surge input detecting circuit 1C are fabricated in the same semiconductor chip.

When the surge voltage is applied to the power supply $V_{DD}$, the surge current flows through the MOS transistors Tr1 and Tr4 or transistors Tr2 and Tr3. At this time, a temperature of the semiconductor chip is abnormally increased. At this time, a forward-biased voltage drop of either of the diodes D5 or D6 becomes lower than a rated value thereof since each rated value of the forward-biased voltage across the diode D5 or D6 is inherently varied according to its surrounding temperature. Consequently, a potential difference between the non-inverting input terminal and the inverting input terminal of either of the comparators 6 or 7 occurs, the potential difference being supplied to either of the gates of the transistors Q5 and Q6 via the output end of either comparator 6 or 7. Thus, either of the transistors Q5 or Q6 is in the on-states. Finally, the power MOS transistors Tr1 through Tr4 are all in the off-states so that the destructive breakdowns of the MOS power transistors Tr1 through Tr4 can be prevented.

Figure 6:
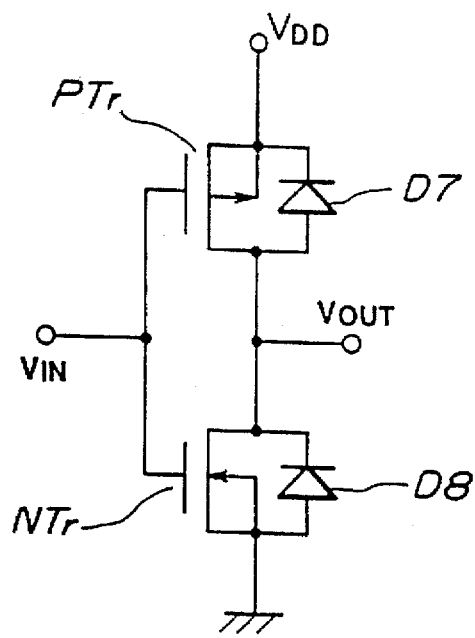
FIG. 6 is a circuit wiring diagram representing a modification of a half bridge of a power driving circuit.

Next, FIG. 6 shows a modification of either half bridge of the power driving circuit.

Although the power MOS transistors Tr1 through Tr4 shown in FIGS. 1 through 5 are constituted by four lateral type N-channel power MOS transistors of the same conductivity types which are incorporated into the two half bridges, the two MOS transistors shown in FIG. 6 are complementally combined to form the half bridge. That is to say, one is a P-channel MOS transistor PTr and the other is an N-channel MOS transistor NTr. The source of the P-channel MOS transistor is connected to the power supply denoted by V and a source of the N-channel MOS transistor is grounded. Each drain and each source of either P-channel MOS or N-channel MOS transistors PTr or NTr are connected via a diode D7 or D8.

In this way, when CMOS (Complementary Metal Oxide Semiconductor) type is formed in the semiconductor chip, it is common practice to form the CMOS type with vertical type MOS transistors. However, in general, the P-channel MOS transistor has a characteristic such that its on-resistance is made higher than that of the N-channel MOS transistor so that a limitation is placed on the reduction of the power losses when the semiconductor chip having the CMOS type power driving circuit is fabricated. Therefore, the following fabrication technique is adopted.

Figure 7:
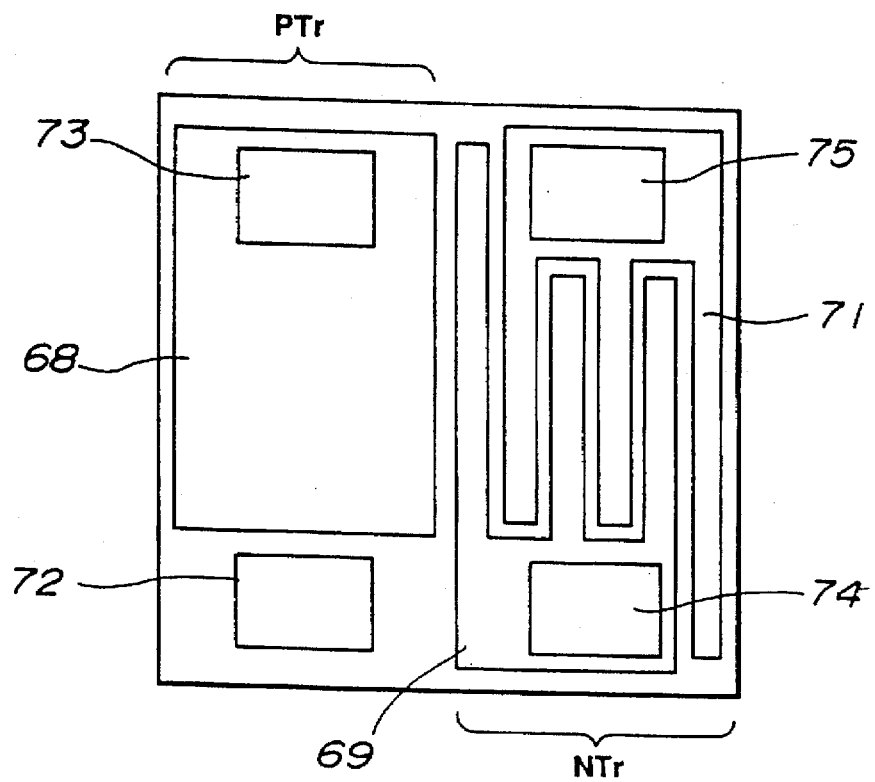
FIG. 7 is a schematic top view of the semiconductor device in a fourth preferred embodiment according to the present invention.
Figure 8:
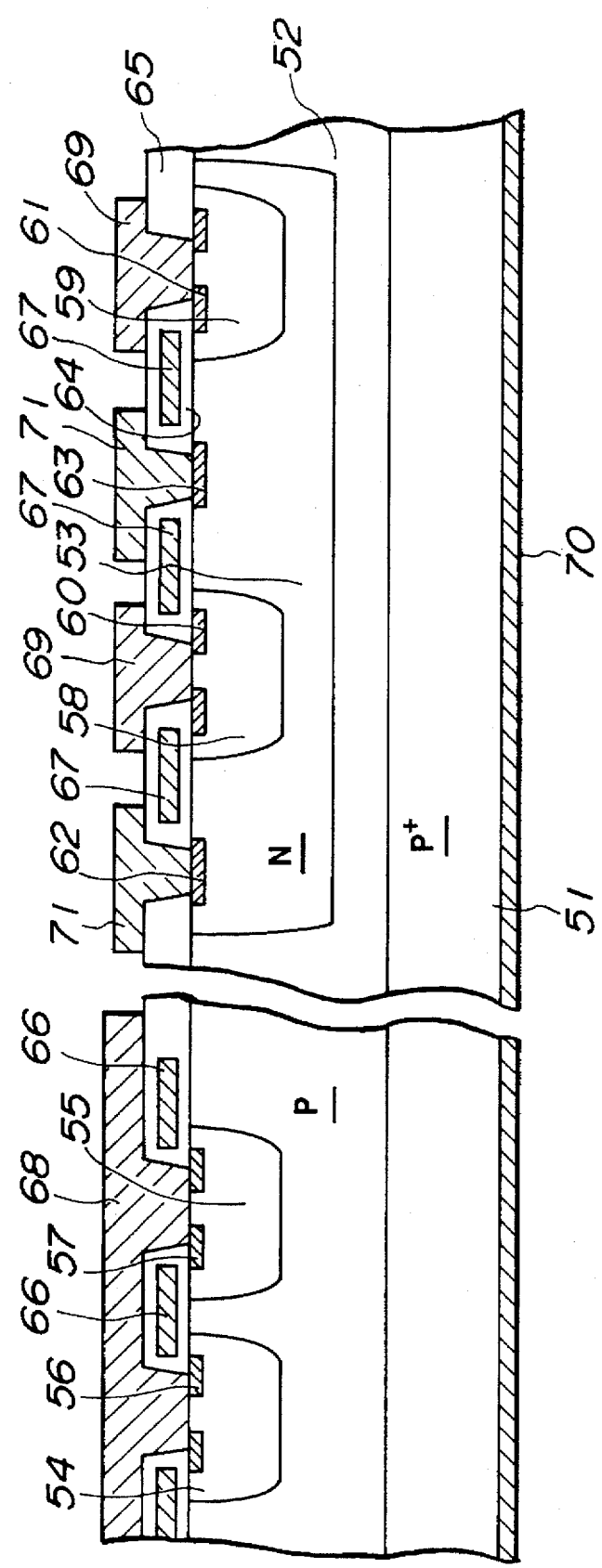
FIG. 8 is a cross sectional view of a semiconductor chip in the case of the fourth preferred embodiment shown in FIG. 7.

FIGS. 7 and 8 show top view and cross sectional view of a fourth preferred embodiment of the semiconductor device according to the present invention applicable to the CMOS type half bridge.

In FIG. 8, an epitaxially grown p type layer 52 is formed in a highly doped (high concentration of impurities) $p^{30}$ type silicon substrate 51.

In addition, an n type region 53 is formed in the p type layer 52.

Then, the semiconductor region is divided into two regions, one region being used to form the P-channel MOS transistor and the other region being used to form the N-channel MOS transistor.

As shown in the left side of FIG. 8, in the P-channel MOS transistor forming region, n type base regions 54 and 55 are spaced apart from each other in the p type region 52. P type source regions 56 and 57 are disposed in the respective n type base regions 64 and 55. Parts of the n type base regions 54 and 55 which extend from the p type source regions 56 and 57 to the interfaces to the p type layer 52 are defined as "channel regions". Gate insulating films 64 are formed on an upper surface of the channel regions and thereafter gate electrodes 66 are formed on the channel regions and insulated with the gate insulating films 64. Thereafter the gate insulating films 64 are partially removed (etched off) and a source electrode 68 which is contacted with the p type source regions 56 and 57 is installed.

A drain electrode 70 is formed on a rear surface of the $p^{30}$ type silicon substrate 51.

In this way, the vertical type double diffusion P-channel MOS transistor PTr shown in FIG. 6 is formed.

It is noted that a p-n junction diode D7 is built in between the drain electrode 70 and source electrode 68.

Next, the N-channel MOS transistor forming region is disposed in the n type region 53 shown in the right side of FIG. 8.

P type base regions 58 and 59 are spaced apart from each other within the n type region 53.

N type source regions 60 and 61 are formed in the p type base regions 58 and 59, respectively.

Both $n^+$ type regions 62 and 63 are formed in the n type region 53 with a space between each other so as to contact with drain electrodes 71.

It is noted that parts of the p type base regions 58 and 59 which extend from the n type source regions 60 and 61 to interfaces to the n type region 53 are defined as "channel regions". Gate electrodes 67 are disposed on the upper surface of the channel regions via the gate insulating films 64.

Furthermore, the gate electrodes 67 are insulated by means of insulating films 65. When the insulating films 65 are opened and a source electrode 69 and the drain electrodes 71 are installed via the openings of the insulating film 65 so that a lateral type double diffusion N-channel MOS transistor Ntr is formed in the semiconductor chip shown in the left side of FIG. 8.

It is noted that since the p-n junction is formed between the n type region 53 and the p type region 58, the built in diode D8 is formed in the N-channel MOS transistor region.

Thus, the semiconductor chip is fabricated as shown in FIGS. 7 and 8.

It is also noted that a pad for each electrode is omitted in FIG. 8.

Figure 9:
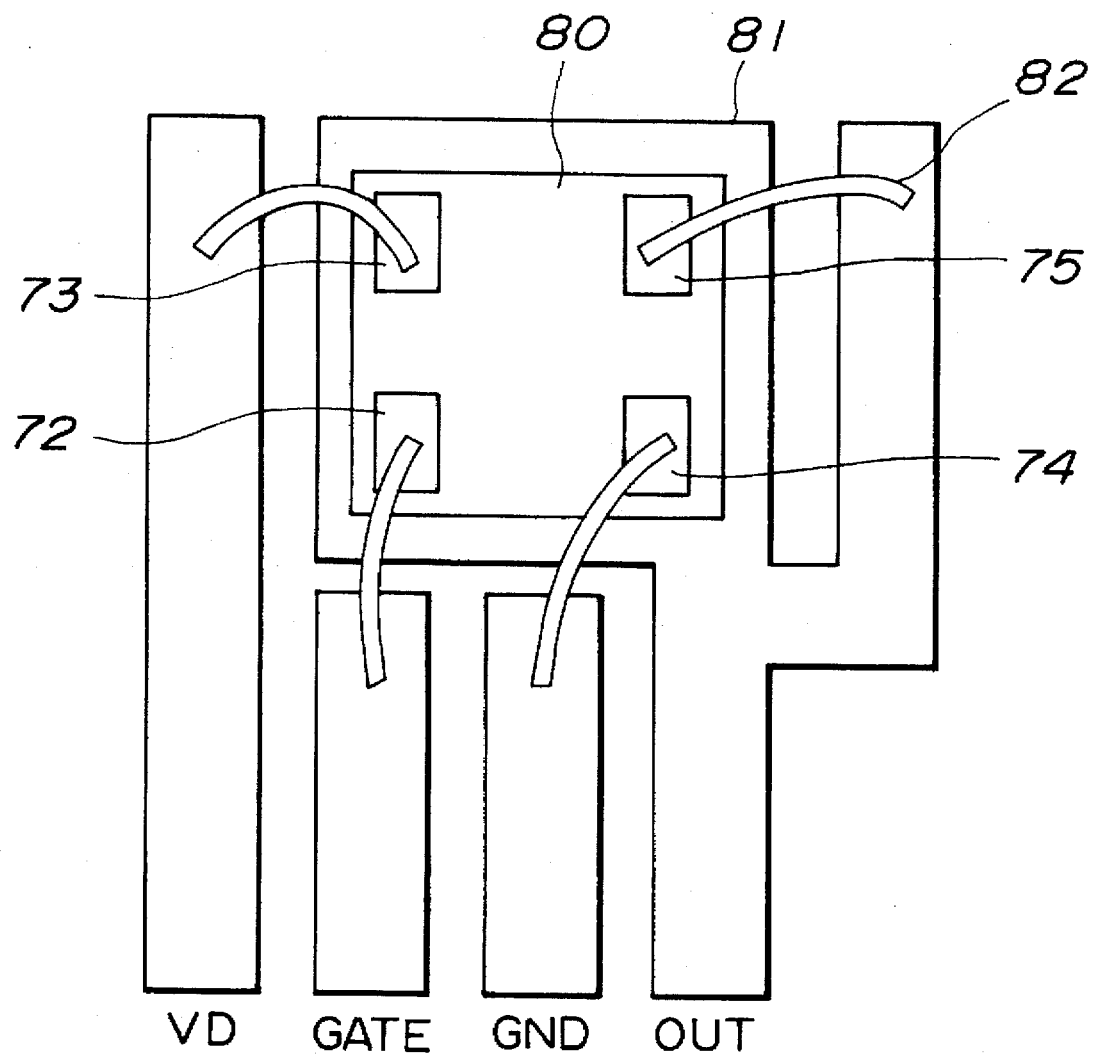
FIG. 9 is a schematic top view of the semiconductor chip in the case of the fourth preferred embodiment shown in FIGS. 7 and 8.

FIG. 9 shows an example of actually mounted semiconductor chip 80 in the fourth embodiment.

As shown in FIG. 9, the drain electrode 70 formed on the rear surface of the vertical type double diffusion P-channel MOS transistor PTr in the semiconductor chip 80 is mounted on a lead frame 81 by means of die bounding and a drain electrode pad 75 of the drain electrode 71 of the lateral type double diffusion N-channel MOS transistor NTr mounted on the lead frame 81 is connected to an output wire OUT via a bonding wire 82.

In addition, the other gate electrode pad 72, a source electrode pad 73 of the vertical type P channel double diffusion P-channel MOS transistor PTr, and a source electrode pad 74 of the lateral type double diffusion N-channel MOS transistor NTr are connected to wires for the gate, the power supply, and the ground, GATE, VD, and GND, respectively, by means of bonding wires.

Consequently, the semiconductor 80 is actually mounted as the half bridge of the power driving circuit as shown in FIG. 6.

As described in the fourth embodiment, since the P-channel MOS transistor PTr is of the vertical double diffusion type and the N-channel MOS transistor NTr is of the lateral double diffusion type and both are formed on the same semiconductor substrate, each on-resistance of the P-channel and N-channel MOS transistors is equally suppressed so that the power loss can be reduced.

Figure 10:
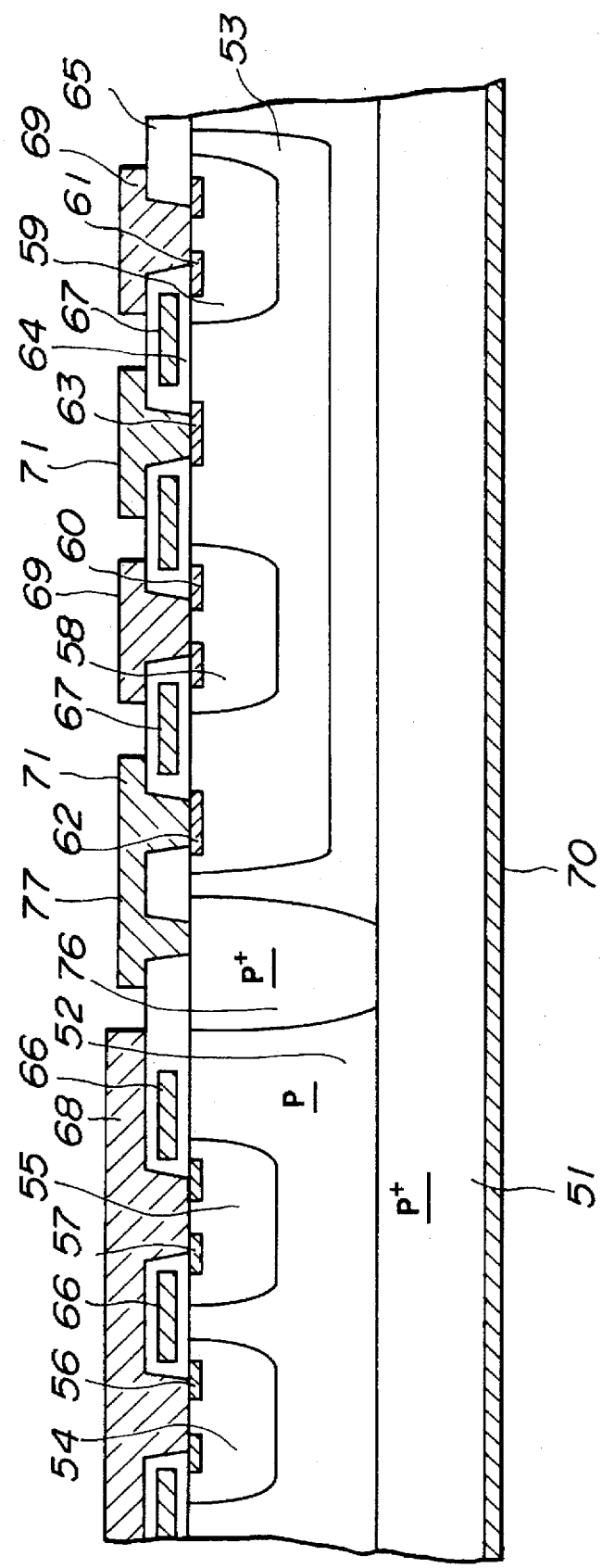
FIG. 10 is a cross sectional view of the semiconductor chip of the semiconductor device in a fifth preferred embodiment according to the present invention.

FIG. 10 shows a cross sectional view of the semiconductor chip in a fifth preferred embodiment of the semiconductor device according to the present invention.

In the fifth embodiment, a $p^+$ type region 76 is formed in the P-channel MOS transistor forming region. The $p^+$ type region 76 extends from a surface of the p type layer 52 and reaches the $p^{30}$ type silicon substrate 51 and a metallic wire 77 is used to connect the drain electrode 71 of the N-channel MOS transistor to the $p^{30}$ type region 76.

Therefore, in this way, the drain electrode 70 of the P-channel MOS transistor described in the fourth embodiment and the drain electrode 71 of the N-channel MOS transistor are interconnected within the same semiconductor substrate 51. The other construction is the same as that in the fourth embodiment shown in FIGS. 7 and 8.

Consequently, the connections of both drain electrodes of the MOS transistors to an external surface, namely, metallic wire bondings utilizing the lead frame are not required for the drain electrodes so that a cost reduction due to a reduction of fabrication labor hours can not only be achieved but also a possibility of failures in the metallic wire breakage and disconnections thereof can be reduced. Thus, a reliability of fabrication of the semiconductor chip can be improved.

Figure 11:
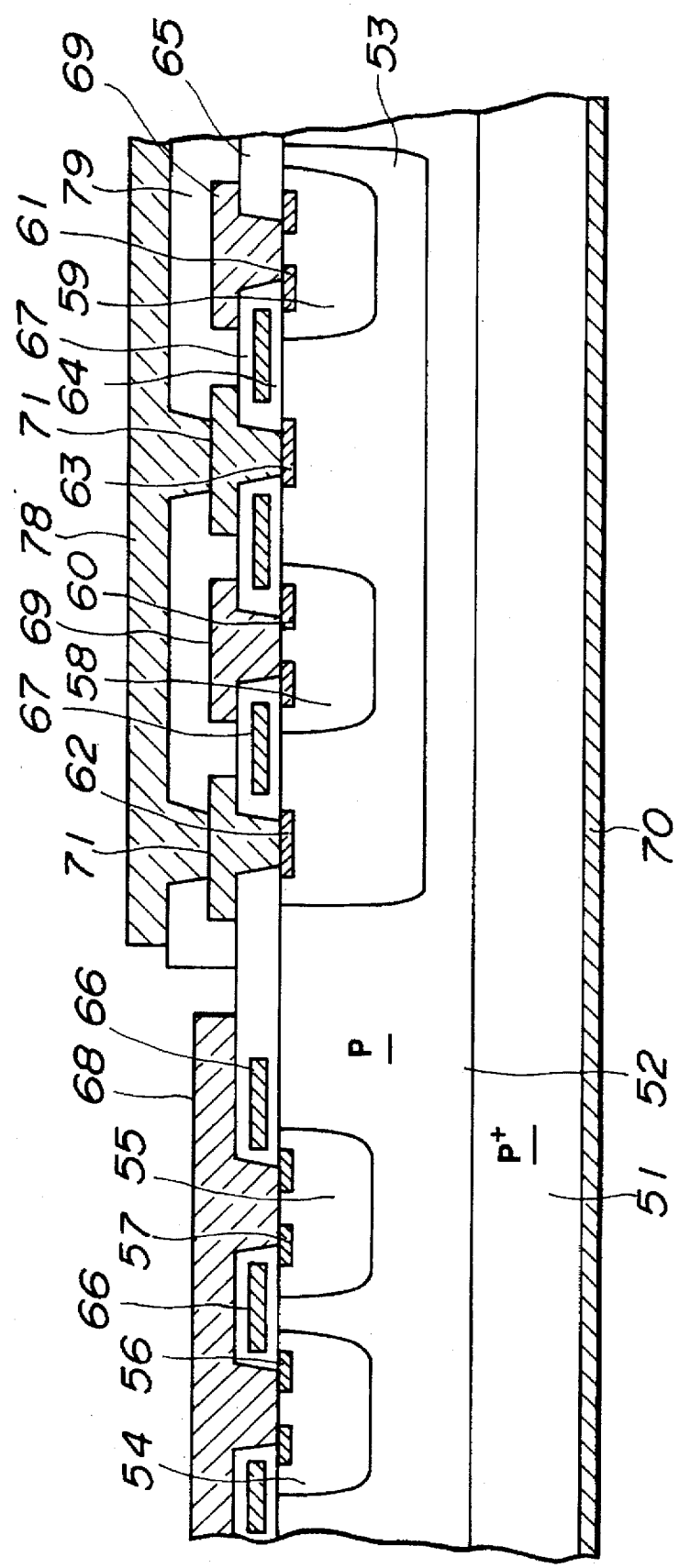
FIG. 11 is a cross sectional view of the semiconductor chip of the semiconductor device in a sixth preferred embodiment according to the present invention.

FIG. 11 shows a cross sectional view of the semiconductor chip in a sixth preferred embodiment of the semiconductor device according to the present invention.

In the sixth embodiment shown in FIG. 11, other insulating films 79 are disposed above the source electrodes 69, respectively, so as to insulate these electrodes and the drain electrodes 71 of the N-channel MOS transistors NTr are all interconnected. That is to say, openings are provided through the insulating films 79 to connect all of the plurality of drain electrodes 71 with each other via a metallic wire 78. The other structures of the N-channel MOS transistors NTr are the same in the case of the fourth embodiment mentioned above.

Hence, resistances of the drain electrodes can be reduced so that the power losses of the N-channel MOS transistors can more remarkably be reduced.

Figure 12:
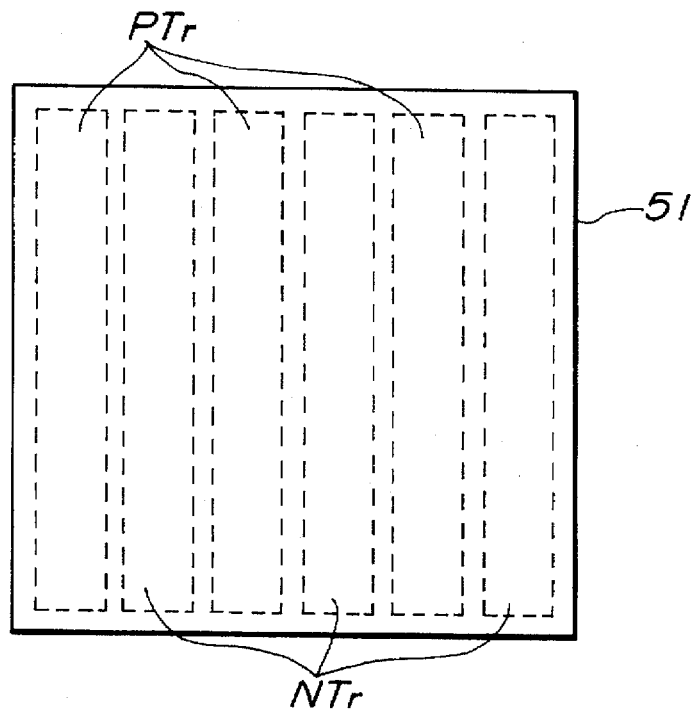
FIG. 12 is a schematic top view of the semiconductor chip representing a modification of an arrangement of the semiconductor device of the fourth preferred embodiment shown in FIGS. 7 and 8.

FIG. 12 shows a schematic top view of the semiconductor chip representing arrangements of the P-channel MOS transistors and N-channel MOS transistors.

As shown in FIG. 12, the three P-channel MOS transistors PTr are longitudinally aligned with respect to the highly doped $p^{30}$ type silicon substrate 51 every one N-channel MOS transistor NTr, namely, arranged alternatingly with the N-channel MOS transistors NTr in the lateral direction of the semiconductor substrate 51.

In this configuration shown in FIG. 12, if the surge voltage is generated between the power supply $V_{DD}$ and the output terminal VOUT and the destructive breakdown occurs in the diode D7 (shown in FIG. 6), a heat generated due to the generation of the surge voltage is easily distributed over the whole semiconductor chip.

Hence, as compared with the structure of the fourth embodiment shown in FIGS. 7 and 8 in which the regions of the P-channel MOS transistor and N-channel MOS transistor are divided and the generated heat is limited into the half portion of the regions, a more higher surge withstanding of the semiconductor device can be achieved.

Figure 13:
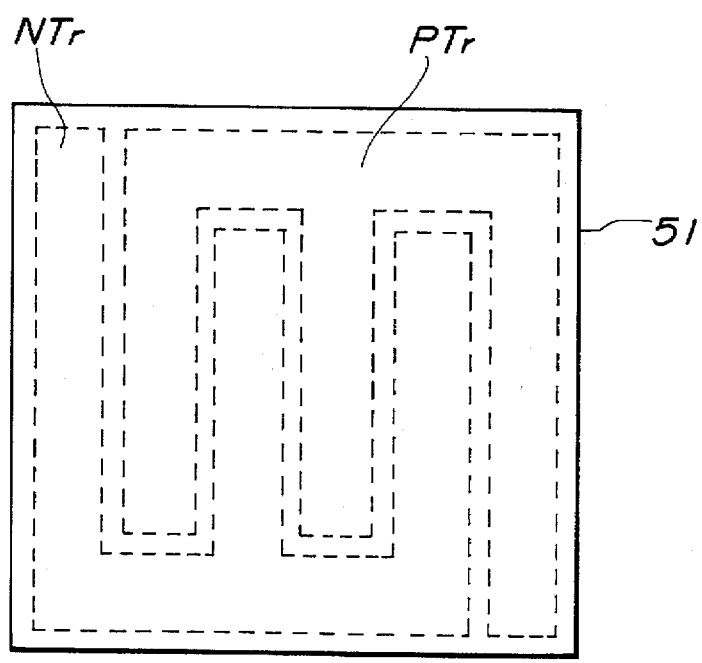
FIG. 13 is a schematic top view of the semiconductor chip representing another modification of the arrangement of the semiconductor device of the fourth embodiment shown in FIGS. 7 and 8.

FIG. 13 shows a schematic top view of a modification of the P-channel MOS transistor and N-channel MOS transistor arrangements other than FIG. 12.

As shown in FIG. 13, the P-channel MOS transistors PTr and the N-channel MOS transistors are arranged in a shape of combs such that both tooth portions of the combs are meshed together, namely, have so-called an interdigit relationship to one another.

In such a configuration as shown in FIG. 13, the generated heat due to the surge voltage generation can be distributed over the whole semiconductor substrate 51. Consequently, the more higher surge breakdown of the semiconductor device can be achieved.

As described hereinabove, since the semiconductor device according to the present invention, in which the four power MOS transistors are arranged to form the half bridges constituting the power driving circuit, the surge input detecting circuit block 1 is installed, the flow of the surge current into the power MOS transistors constituting the power driving circuit of, for example, the reversible motor M, can be prevented by turning the power transistors in the off-states, so that the destructive breakdowns (failures) of the power MOS transistors can be prevented.

Particularly, since, in the first embodiment of FIG. 2, the surge input detecting circuit block includes the zener diode whose cathode is connected to the power supply terminal $V_{DD}$, the two series-connected resistors whose one end is connected to the anode of the zener diode and whose the other end is connected to the ground, and the transistor whose base is connected to the junction between the two resistors, the zener diode breaks down and the breakdown current cause the two resistors to generate the voltage at the junction thereof if the surge voltage exceeding the predetermined voltage (namely, maximum rated power supply voltage) is generated. The signal to make the power transistors in the off-states on the basis of the voltage is supplied to the gates of the power MOS transistors. Since the predetermined voltage can simply be set according to a selection of the zener diode and the semiconductor structure can be simplified.

In addition, since, in the embodiment shown in FIG. 4, the surge input detecting circuit block includes the comparator which compares the potential difference between the potential of the half bridge with respect to the ground and the reference potential and the transistor which generates the signal to turn the MOS power transistors in the off-states (in the nonconductive sates) according to the output signal of the comparator, the signal to turn the power transistors in the off-states on the basis of a change in the potential of the half bridge when the surge current flows in the half bridge is supplied to the gates of the power transistors. Since the comparator which compares the potential difference between the potential of the half bridge and the reference potential is used, an accuracy of an operation level which turns the power transistors in the off-states can be high.

Furthermore, since, in the embodiment shown in FIG. 5, the surge input detecting circuit block includes the diode and monitoring means for monitoring the forward-biased voltage drop of the diode, and the transistor which generates the signal to turn the MOS power transistors in the off-states according to the output of the monitoring means, the monitoring means monitors the forward-biased voltage drop of the diode based on the characteristic change of the diode caused by the temperature rise of the semiconductor chip when the surge current flows into the semiconductor chip. According to the monitored result, the destructive breakdowns of the power transistors corresponding to the characteristic change in the diode can be prevented.

The other various effects can be achieved by the semiconductor device according to the present invention.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device, comprising:
   (a) a power driving circuit having a first half bridge and a second half bridge, each of the first and second half bridges including two series-connected power transistors having a junction therebetween, a first of the power transistors of each half bridge being connected between a power supply terminal and the junction, a second of the power transistors of each half bridge being connected between the junction and a ground terminal, the junction of the first half bridge being connected to the junction of the second half bridge through a load, a first current path flowing through the first power transistor of the first half bridge, the load and the second power transistor of the second half bridge, a second current path flowing through the first power transistor of the second half bridge, the load and the second power transistor of the first half bridge, and
   (b) surge input detecting means connected to the power supply terminal and to a gate terminal of each of the power transistors of the first and second half bridges, for detecting when an input voltage to the power supply terminal exceeds a predetermined voltage and for generating gate signals to turn the power transistors to off-states when the input voltage exceeds the predetermined voltage.

2. A semiconductor device as set forth in claim 1, wherein said predetermined voltage is set to a maximum rated power supply voltage of the power driving circuit and a sum of breakdown voltages of the power transistors in each of the first and second current paths is set larger than said maximum rated power supply voltage.

3. A semiconductor device as set forth in claim 2, wherein said surge input detecting means comprises: a zener diode whose cathode is connected to said power supply terminal; two resistors connected between an anode of said zener diode and the ground and connected in series with each other; and a bipolar transistor whose base is connected to a junction between said two resistors, emitter is grounded, and collector is connected to the gate terminals of the power transistors of one of the first and second current paths.

4. A semiconductor device as set forth in claim 3, wherein an avalanche breakdown voltage of the zener diode is set to be lower than that of each of said two series-connected power transistors constituting one of said first half bridge and said second half bridge.

5. A semiconductor device as set forth in claim 4, wherein when a voltage across one of said two resistors is increased over the on voltage of the base-emitter of said transistor of said surge input detecting means, the two power transistors of said one of the first and second current paths are turned to the off-states.

6. A semiconductor device as set forth in claim 5, wherein said surge input detecting means, each of said two series-connected power transistors in the first and second half bridges, and freewheel diodes associated with each of the power transistors in the first and second half bridges are integrally fabricated onto a single semiconductor chip.

7. A semiconductor device as set forth in claim 6, wherein said semiconductor chip comprises: a p type substrate, first and second mutually separated $n^+$ type buried layers extended over a main surface of said p type substrate; a p type layer formed on the first and second $n^+$ type buried layers using an epitaxial growth; an n type region formed within said p type layer and reaching the first $n^+$ type buried layer; two mutually separated p type base regions formed within said n type region; a plurality of $n^+$ drain regions formed within said n type region to be connected to drain electrodes of the first power transistors of the first and second half bridges; an $n^+$ type source region and a p type region formed within each of the p type base regions; a gate insulating film disposed on the surface of said n type region; a plurality of gate electrodes formed on said gate insulating film; a top insulating film covering the gate electrodes; source electrodes and said drain electrodes formed on windows of said gate insulating film and connected to said source and drain regions; a zener diode n type cathode region formed within the p type layer so as to reach the second $n^+$ type buried layer; a zener diode p type anode region formed within said n type cathode region so as to reach the second $n^+$ type buried layer; an $n^+$ type cathode region and a $p^{30}$ type anode region respectively being within the zener diode n type and p type regions; a bipolar n type collector region formed within said p type layer adjacent said $n^+$ type cathode region; a bipolar p type base region formed within the bipolar n type collector region; an n type emitter region formed within said p type base region; and an $n^+$ type collector region and a $p^{30}$ type base region formed within the n type collector region and the p type base region, respectively.

8. A semiconductor device as set forth in claim 7, wherein a first group of metal electrodes is used to wire each of the cathode and anode regions of said zener diode, a second group of metal electrodes further being used to wire each of the collector region, the emitter region and the base region of the bipolar transistor.

9. A semiconductor device as set forth in claim 8, wherein said cathode region of the zener diode is connected to said drain electrode of the first power transistor of said one of the first and second half bridges with a first metallic wire, said anode region of the zener diode is connected to a first one of the two resistors, a base electrode contacted with the $p^{30}$ type base region is connected to said first one of the two resistors and is connected, via a second metallic wire, to the second one of said two resistors, an emitter electrode contacted with said n type emitter region is connected to said second one of the two resistors via a third metallic wire and to the ground terminal, a collector electrode adjacent to the n type emitter region is connected to the gate electrode of said first power transistor of the first and second half bridges via a fourth metallic wire, said base region, emitter region, and collector region constituting a bipolar n-p-n transistor.

10. A semiconductor device as set forth in claim 2, wherein said surge input detecting means comprises: a comparator which is so constructed as to compare a potential of one of said first and second half bridges with a reference potential; and a transistor, connected between an output terminal of said comparator and the gate terminals of the power transistors of one of the first and second current paths, and to generate a signal to turn the two power transistors of said one of the first and second current paths to the off-states when inputs of said comparator generate a predetermined potential difference.

11. A semiconductor device as set forth in claim 10, wherein said comparator has inverting and non-inverting input terminals, the non-inverting input terminal thereof being connected to the ground terminal via a resistor connected between the ground terminal and the source of the second power transistor of said one of the first and second half bridges, and the inverting input terminal thereof being connected to a junction between the two resistors connected between the reference power supply and the ground terminal, said transistor of the surge input detecting means having its gate connected to the output terminal of said comparator, its source connected to the ground terminal, and its drain connected to the gates of said power transistors of said one of the first and second current paths.

12. A semiconductor device as set forth in claim 2, wherein said surge input detecting means comprises: a reference power supply; a first resistor and a diode, connected in series with each other and connected between said reference power supply and the ground terminal; monitoring means for monitoring a forward voltage drop of said diode; and a transistor, connected between said monitoring means and gate terminals of the power transistors of one of the first and second current paths to render the two power transistors of said one of the first and second current paths in the off-states when said monitoring means detects a predetermined voltage drop.

13. A semiconductor device as set forth in claim 12, wherein each of the power transistors of the first and second half bridges is a MOS transistor.

14. A semiconductor device as set forth in claim 13, wherein a freewheel diode is connected between a drain and a source of each of the power transistors of the first and second half bridges and the load is a reversible motor.

15. A semiconductor device as set forth in claim 12, wherein a comparator constituting said monitoring means has an inverting input terminal connected to an anode of the diode and to the reference power supply via the first resistor, a cathode of said diode being grounded, and a non-inverting input terminal connected to a junction between second and third resistors, another end of said third resistor being connected to said reference power supply, and said transistor of said surge input detecting means has a gate connected to an output terminal of said comparator, a drain thereof connected to the gate terminals of said two power transistors of said one of the first and second current paths, and a source grounded.

* * * * *